United States Patent [19]
Rolson

[11] Patent Number: 5,851,701
[45] Date of Patent: Dec. 22, 1998

[54] ATOM LITHOGRAPHIC MASK HAVING DIFFRACTION GRATING AND ATTENUATED PHASE SHIFTERS

[75] Inventor: J. Brett Rolson, Boise, Id.

[73] Assignee: Micron Technology, Inc., Boise, Id.

[21] Appl. No.: 831,066

[22] Filed: Apr. 1, 1997

[51] Int. Cl.$^6$ .................................................. G03F 9/00
[52] U.S. Cl. ............................................................ 430/5
[58] Field of Search ............................. 430/5, 311, 313, 430/322; 378/34, 35

[56] References Cited

U.S. PATENT DOCUMENTS

| | | | |
|---|---|---|---|
| 4,326,805 | 4/1982 | Feldman et al. | 356/399 |
| 5,240,796 | 8/1993 | Lee et al. | 430/5 |
| 5,447,810 | 9/1995 | Chen et al. | 430/5 |
| 5,480,747 | 1/1996 | Vasudev | 430/5 |
| 5,587,834 | 12/1996 | Noguchi et al. | 430/5 |
| 5,624,773 | 4/1997 | Pforr et al. | 430/5 |

OTHER PUBLICATIONS

Luehrmann, Paul et al., "0.35 μm Lithography Using Off–Axis Illumination", Technical Paper, SPIE—Optical/Laser Microlithography VI Conference, San Jose, California, Mar., 1993.

Kang, Ho–Young, et al. A new Method of Tilted Illumination using Grating Mask;ATOM (Advanced Tilted illumination On Mask), SPIE vol. 1927 Optical Laser Microlithography VI Mar. 1993) p. 226.

*Primary Examiner*—S. Rosasco
*Attorney, Agent, or Firm*—Stephen A. Gratton

[57] ABSTRACT

An ATOM lithographic mask includes a transparent substrate having a pattern of attenuated phase shifters and a diffraction grating aligned with the attenuated phase shifters. The attenuated phase shifters form the primary mask pattern, while the diffraction grating diffracts exposure energy directed through the mask to provide off axis illumination for the attenuated phase shifters. The diffraction grating includes chromeless phase shifters formed using an additive or subtractive process. Both the attenuated phase shifters and diffraction grating can be formed as simple line-space patterns or in other patterns as required. In an alternate embodiment the diffraction grating is formed on a separate mask.

37 Claims, 3 Drawing Sheets

ATOM LITHOGRAPHIC MASK HAVING DIFFRACTION GRATING AND ATTENUATED PHASE SHIFTERS

FIELD OF THE INVENTION

This invention relates generally to lithography and specifically to an improved lithographic mask, to a method for making the mask, and to a lithographic system including the mask.

BACKGROUND OF THE INVENTION

Photolithography is widely used in semiconductor manufacture and other applications. During photolithography, an exposure energy, such as ultraviolet light, is passed through a mask and onto a target such as a semiconductor wafer. The mask contains opaque and transparent regions which form a primary mask pattern. The exposure energy exposes the mask pattern on a layer of resist deposited on the target. Following exposure, the layer of resist can be developed to form a resist mask. In semiconductor manufacture, such a resist mask can be used for etching, ion implantation and other processes.

One recently developed form of lithography is phase shift lithography. With phase shift lithography the mask can include phase shifters on selected portions of the mask pattern. The phase shifters shift the exposure energy passing therethrough, relative to exposure energy passing through an adjacent area of the mask. The phase shifting initiates a wave canceling which helps to overcome diffraction from the edges of the features. In addition, adjacent dark and bright areas are created on the wafer which clearly delineate the corresponding printed features.

One type of phase shift mask includes attenuated phase shifters. With an attenuated phase shift mask the exposure energy is attenuated (i.e., absorbed) as well as phase shifted. FIG. 1 illustrates an attenuated phase shift mask 10. This type of phase shift mask 10 is also referred to as an "embedded" phase shift mask. The attenuated phase shift mask 10 includes a transparent substrate 11 and a pattern of attenuated phase shifters 12. The phase shifters 12 comprise a thin film configured to absorb a portion of the exposure energy and to transmit the remaining portion. Suitable materials for forming the phase shifters 12 include molybdenum silicide, and mixtures of chrome, nitrogen, and oxygen.

With the attenuated phase shifters 12 the transmitted portion of exposure energy is phase shifted relative to exposure energy directed through clear portions of the substrate 11. Preferably the thin film which forms the attenuated phase shifters 12 is selected to provide from 80–95% attenuation of the exposure energy and a phase shift of $\pi$ (180°). The phase shifted exposure energy interferes with the non-phase shifted energy increasing the sharpness and resolution of the features defined by the attenuated phase shifters 12. With a positive tone resist the features print as thin lines.

Another recently developed technique in photolithography increases the resolution at the target by changing the manner in which the exposure energy illuminates the mask. In particular, the exposure energy is projected through the mask at an angle that is offset from an optical axis of the lithographic system. This illumination technique is referred to as "off-axis" or "tilted" illumination. Representative off-axis illumination techniques include annular illumination and multi-pole illumination.

FIG. 2 illustrates an off axis illumination lithographic system 13. The system 13 includes an optical axis 14 and an exposure source 15 configured to emit a beam of exposure energy such as UV light. The exposure energy is initially directed along the optical axis 14 of the system 13. However, a screen 16 is positioned adjacent to the source 15 and includes an annular aperture 18. The annular aperture 18 is designed to eliminate the center portion of the beam of exposure energy emitted by the source 15. This blocks the on-axis "0"order unmodulated energy and allows the illumination to come from a left side illumination beam 20 and a right side illumination beam 22 that are off-axis with respect to the optical axis 14. The off-axis illumination beams 20, 22 are focused by a condenser 24 at oblique angles of incident ($\theta$) onto a mask 26. The mask 26 is located at the object plane of the lithographic system 13 and includes a transparent substrate 27 and opaque features 28 that form a primary mask pattern. After diffracting through the mask 26, the illumination beams 20, 22 are filtered by a spatial filter 30 and focused by an objective lens 34 onto a target 36. The spatial filter 30 includes an entrance pupil 32 which functions to prevent certain orders of the diffraction pattern from striking the target 36. Image formation now occurs by the interference of two beams being the "0"order and either the "+1" or "−1" diffracted beams.

One shortcoming of the off-axis illumination system 13 is that extensive modifications are required to a conventional lithographic system to provide the off-axis illumination. In addition, because the center of the exposure energy must be blocked, the illumination intensity is decreased. The low illumination intensity requires longer photoresist exposure times and decreases the throughput of the targets. Furthermore, the low illumination intensity can cause non-uniformity in the features imaged on the targets.

One recently developed method for off axis illumination places an additional grating mask between the exposure source and the primary mask. The grating mask includes a grating pattern for generating diffracted light. The light diffracted by the grating pattern provides off axis illumination for the primary mask pattern. Such a method is referred to as ATOM (Advanced Tilted Illumination On Mask). This method is described in the technical article by Kang et al. entitled "A new Method of Tilted Illumination using Grating Mask; ATOM (Advanced Tilted Illumination On Mask)", SPIE Vol. 1927, Optical/Laser Microlithography VI (1993) pg. 226.

FIG. 3 illustrates an ATOM lithographic system 38. The ATOM lithographic system 38 includes an optical axis 14 and exposure source 15 as previously described. However, in the ATOM lithographic system 38, a screen 16A allows all of the exposure energy from the source 15 to impinge on the condenser 24. In addition, the condenser 24 rather than focusing on the primary mask 26, focuses the exposure energy on a grating mask 40.

The grating mask 40 comprises a transparent substrate 43 having a grating pattern of phase shift grooves 41 formed therein. The grating mask 40 is similar in construction to a chromeless phase shifting reticle formed with subtractive phase shifters. Light passing through a phase shift groove 41 is phase shifted relative to light passing through an adjacent full thickness portion of the substrate 43. The phase shift grooves 41 function as a diffraction grating to generate diffracted light having an odd numbered order. The resultant zero order diffraction light interferes destructively and the resultant first order diffraction light interferes constructively. The diffracted light impinging on the primary mask 26 comprises a "tilted" or "off axis" illumination beam. The ATOM lithographic system 38 increases the resolution (R) and the depth of focus (DOF) at the target 36. The resolution (R) and depth of focus (DOF) are a function of the angle of incident light ($\theta_i$), the pitch of the grating members ($P_g$), the numerical aperture (NA), and the wavelength ($\lambda$) of the exposure energy. These relationships can be expressed by the formulae $\theta_i = \sin^{-1}(\lambda/P_g)$ and $R = \lambda/2NA(1+\sin\theta_i/NA) = \lambda/2NA(1+\alpha)$ where $\alpha = \sin\theta_i/NA$ The present invention is directed to an improved lithographic mask in which a diffraction grating and attenuated phase shifters are incorporated into the same mask. The improved mask provides an increased intensity at the target and eliminates the need to align a separate diffraction grating with the primary mask. In an alternate embodiment, a lithographic system can include a conventional phase shift mask with attenuated phase shifters and a separate diffraction grating mask.

SUMMARY OF THE INVENTION

In accordance with the present invention, an improved lithographic mask, a method for fabricating the mask, and a lithographic system utilizing the mask are provided. The mask includes: a transparent substrate; a pattern of attenuated phase shifters formed proximate to a first side of the substrate; and a diffraction grating formed proximate to a second side of the substrate in alignment with the pattern of attenuated phase shifters. The attenuated phase shifters form a primary mask pattern for exposing a layer of resist on a target using an exposure energy directed through the mask. The diffraction grating includes diffraction phase shifters configured to phase shift and diffract the exposure energy to provide off axis illumination for the attenuated phase shifters.

The mask can be fabricated from a conventional mask blank comprising a quartz substrate and a light absorbing layer formed of a material such as molybdenum silicide, or mixtures of chrome nitrogen and oxygen. During the fabrication process, a layer of photoresist can be deposited on the quartz side (i.e., back side) of the mask blank. A diffraction pattern can then be written into the layer of photoresist using an optical or e-beam mask writer. Developing the layer of resist forms a resist mask that can be used to form the diffraction phase shifters and the diffraction grating. The diffraction phase shifters can be formed by etching the substrate using the resist mask. Alternately, the diffraction phase shifters can be additive phase shifter formed by depositing and patterning a transparent phase layer on the substrate.

Following (or alternately prior to) formation of the diffraction grating, a second layer of resist can be deposited on the light absorbing layer. The second layer of resist can then be written with a pattern for attenuated phase shifters and developed to form a resist mask. The resist mask can be used to etch the light absorbing layer to form the attenuated phase shifters. The light absorbing layer can be formed with a thickness selected to provide a desired amount of light absorption and a desired phase shift.

In addition, the attenuated phase shifters can include an outer dielectric layer or a subjacent dielectric layer. With a dielectric layer, both the light absorbing layer and the dielectric layer contribute to the phase shift. With an outer dielectric layer, the mask blank can include a dielectric layer covering the light absorbing layer. The dielectric layer would be "patterned" along with the light absorbing layer preferably using a separate etch step. With a dielectric layer subjacent to the light absorbing layer, the dielectric layer would be removed in "clear" areas of the pattern. The phase shift would occur between the "clear" areas and the "patterned" areas.

A lithographic system constructed in accordance with the invention includes the mask with the diffraction grating and attenuated phase shifters. The diffraction grating provides off axis illumination for the attenuated phase shifters. In an alternate embodiment system, the diffraction grating rather that being formed on the same mask as the attenuated phase shifters is formed on a separate diffraction mask.

DETAILED DESCRIPTION OF THE PREFERRED EMBODIMENTS

As used herein, the term "mask" refers to an element that can be used directly to project a pattern onto a target during a lithographic process or to form a "working mask" by printing or other techniques. The term "diffraction grating" refers to a pattern of chromeless phase shifters, or other members, configured to produce diffracted and phase shifted light suitable for off axis illumination of a corresponding mask pattern. The term "chromeless phase shifter" refers to a transparent optical element configured to achieve a desired phase shift for exposure energy directed through the phase shifter relative to exposure energy directed through another portion of the mask.

Figure 1:
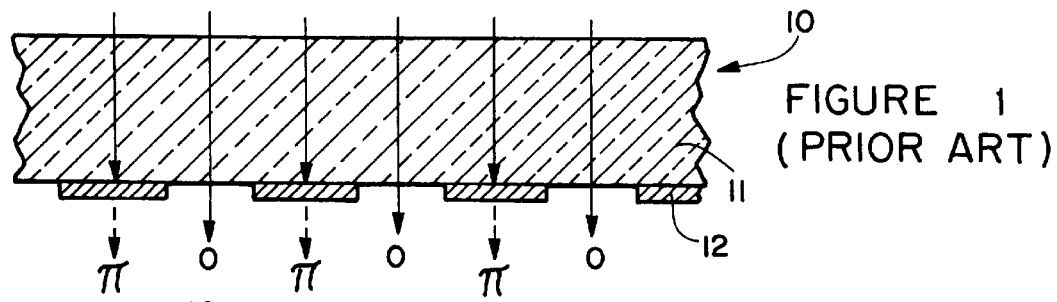
FIG. 1 is a schematic cross sectional view of a prior art attenuating phase shift mask having attenuated phase shifters.
Figure 2:
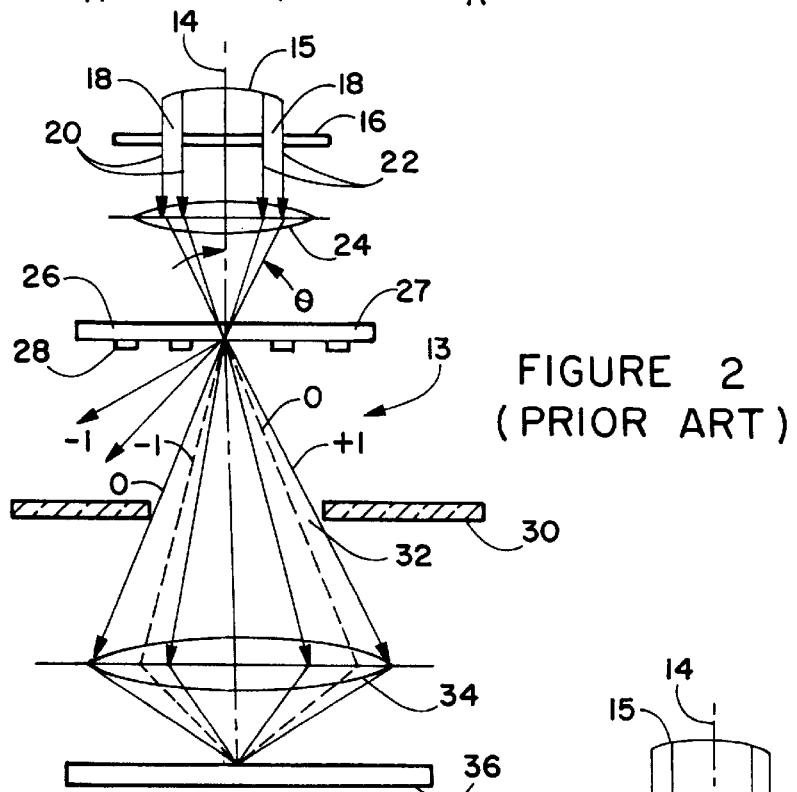
FIG. 2 is a schematic view of a prior art lithographic system having off-axis illumination.
Figure 3:
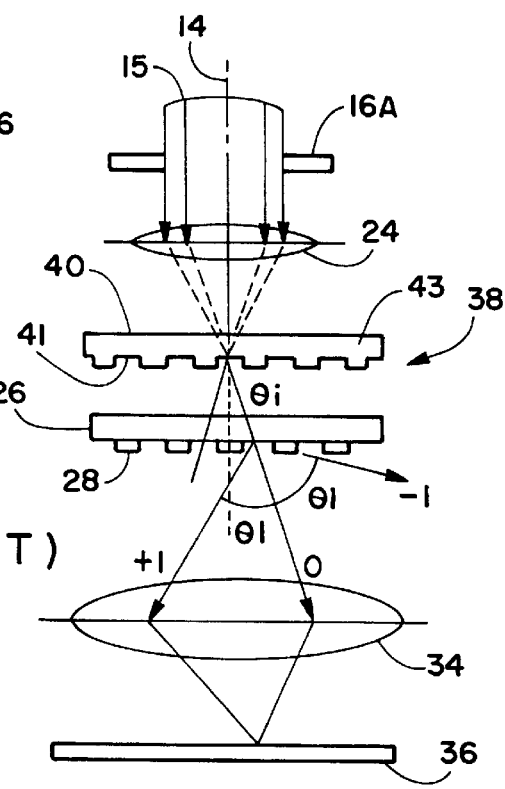
FIG. 3 is a schematic view of a prior art ATOM lithographic system utilizing a separate ATOM mask.
Figure 4A:
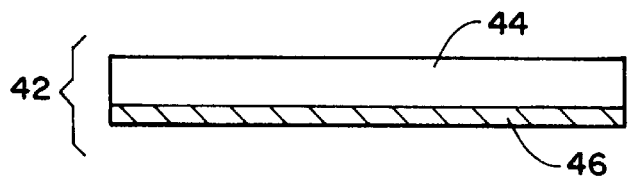
FIGS. 4A–4E are schematic cross sectional views illustrating steps in a method for forming a lithographic mask in accordance with the invention.

Referring to FIGS. 4A–4E, a method for forming a lithographic mask is shown. Initially, as shown in FIG. 4A, a mask blank 42 is provided. The mask blank 42 includes a transparent substrate 44 and an absorber layer 46. Standard mask blanks are manufactured and sold by mask makers for use in lithography. One supplier is Dupont Photoblanks of Poughkeepsie, N.Y.

The substrate 44 can comprise a transparent material having suitable optical and mechanical properties for lithographic processes. Suitable materials include quartz and silica based glass. The absorber layer 46 can be formed of a material such as molybdenum silicide or a mixture of chrome, nitrogen and oxygen. The absorber layer 46 can be blanket deposited on the substrate 44 and planarized to a thickness selected to absorb and phase shift exposure energy passing through the absorber layer 46. A representative thickness of the absorber layer 46 can be several hundred angstroms or less. In general, the thickness of the absorber layer 46 can be selected to absorb a certain percentage of the exposure energy during a lithographic process (e.g., 80%–95%). In addition, the thickness of the absorber layer 46 can be selected to produce a phase shift of π or odd whole multiple thereof for exposure energy transmitted through the layer.

Figure 4B:
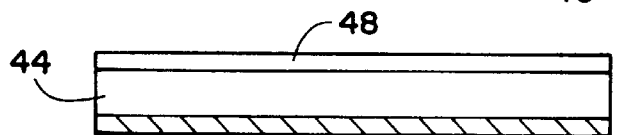

Referring to FIG. 4B, a layer resist 48 can be deposited on the quartz side of the substrate 44 to a desired thickness. The layer of resist 48 can be exposed with a desired diffraction grating pattern and then developed. Exposure of the layer of resist 48 can be with an optical or an e-beam method. A suitable optical resist can include 895I manufactured by OMM of East Providence, R.I. A suitable laser writer is an "ALTA 3000" manufactured by Etec Systems Inc., Hayward, Calif. A suitable e-beam system for exposing the resist can include an e-beam mask writer such as a "MEBES 4500" manufactured by ETEC Systems, Inc., Hayward, Calif.

Figure 4C:
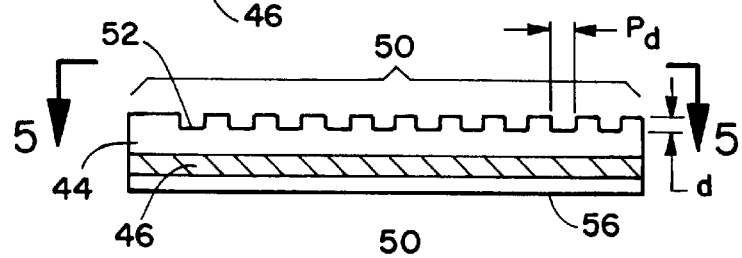
Figure 4D:
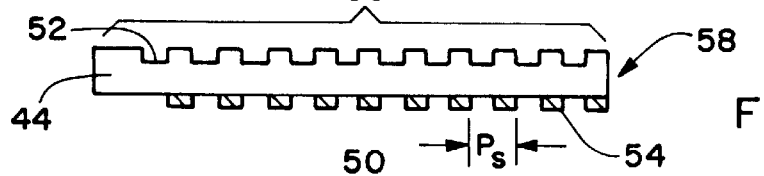

Referring to FIG. 4C, exposure and development of the layer of resist 48 forms a resist mask that can be used to etch the quartz substrate 44 to form a diffraction grating 50. The diffraction grating 50 comprises diffraction phase shift grooves 52 etched into the quartz substrate 44 to a depth "d". As will be further explained, the diffraction grating 50 functions as an ATOM grating for off axis illumination of a subsequently formed primary mask pattern formed by a pattern of attenuated phase shifters 54 (FIG. 4D).

One suitable process for etching the diffraction phase shift grooves 52 into the substrate 44 to the depth "d" is plasma dry etching. With a quartz substrate 44, an anisotropic dry etch process can be performed in a reactive ion etch (RIE) chamber using a gas etchant such as $CHF_3/O_2$. An isotropic etch process can also be performed using a suitable wet etchant such as a buffered oxide etchant (e.g., $NH_4F:HF$ mixture). Etching can also be performed using magnetically enhanced reactive ion etching (MERIE).

The depth "d" of the diffraction phase shift grooves 52 can be selected to achieve a desired phase shift for the exposure energy. This depth can be determined by the well known formula $d = i\lambda/2(n-1)$
where i = an odd integer λ = wavelength of exposure light and n = refractive index of phase shift material at the exposure wavelength.

Figure 5:
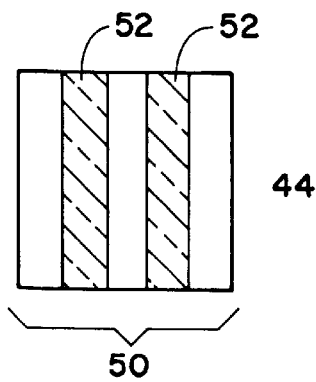
FIG. 5 is a schematic plan view taken along section line 5–5 of FIG. 4C illustrating a line space pattern for the diffraction grating.

By way of example, the depth "d" can be selected to provide a phase shift of 180°, or odd multiple thereof, for exposure energy passing through the diffraction phase shift grooves 52 relative to exposure energy passing through a full thickness of the substrate 44. Viewed from above the phase shift grooves 52 can be formed in a pattern that corresponds to the pattern of the attenuated phase shifters 54 (FIG. 4D). For example, both the diffraction grating 50 (FIG. 4C) and the attenuated phase shifters 54 (FIG. 4D) can be arranged in simple line space patterns. FIG. 5 illustrates the diffraction grating 50 in a simple line space pattern with the diffraction phase shift grooves 52 comprising elongated linear members. In this case, the attenuated phase shifters 54 (FIG. 4D) could also be formed in a simple line space pattern and would also comprise elongated linear members.

Still referring to FIG. 4C, following the etch procedure for forming the diffraction phase shift grooves 52, the layer of resist 48 (FIG. 4B) can be stripped and a second layer of resist 56 can be deposited on the absorber layer 46. A pattern for the attenuated phase shifters 54 (FIG. 4D) can be exposed in the second layer of resist 56. An optical or E-beam mask writer can be used, as previously explained, to expose or write a desired pattern into the second layer of resist 56. During the mask writing procedure the pattern for the attenuated phase shifters 54 (FIG. 4D) can be aligned with the pattern of the diffraction grating 50 (FIG. 4C). This can be done using viewing optics associated with the mask writer and alignment marks on surfaces of the diffraction grating or absorber layer 46 if required.

Referring to FIG. 4D, following exposure, the second layer of resist 56 can be developed to form a resist mask for etching the absorber layer 46 to form the attenuated phase shifters 54. Etching of the absorber layer 46 can be with a wet or dry etch process. The pitch "Ps" of the attenuated phase shifters 54 can correspond to the pitch "Pd" (FIG. 4C) of the diffraction phase shift grooves 52. Alternately, the attenuated phase shifters 54 can be offset from the diffraction phase shift grooves 52 as required. In general, the pitch "Ps" can be selected to offer the maximum possible resolution and depth of focus depending on a given pattern for the attenuated phase shifters 54. The completed ATOM mask 58 includes the diffraction grating 50 and the pattern of attenuated phase shifters 54.

Figure 4E:
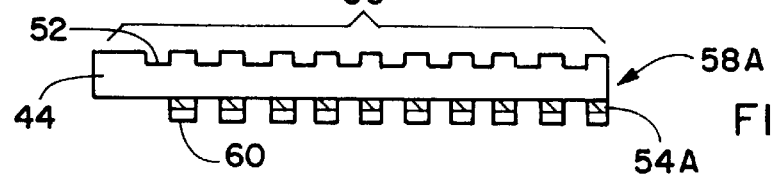

Referring to FIG. 4E, an alternate embodiment atom mask 58A can include a dielectric layer 60, such as a layer of $SiO_2$. The dielectric layer 60 can be an "outer" layer that covers the attenuated phase shifters 54A but is removed in the "clear" or "unpatterned" areas of the substrate (i.e., areas between the phase shifters 54A). In the alternate embodiment mask 58A, the mask blank 42 would initially include the dielectric layer 60. In addition, an additional etch step can be performed to etch the dielectric layer 60 in the "clear" or "unpatterned" areas, followed by the previously explained etch of the absorber layer 46 (FIG. 4C) to form the attenuated phase shifters 54A. Etching of the dielectric layer 60 can be with wet or dry etchants known in the art. For example with an outer dielectric layer 60 formed of $SiO_2$, a wet etch can be performed using a solution of $NH_4:HF$.

In the alternate embodiment atom mask 58A (FIG. 4E), the total phase shift for exposure energy passing through the attenuated phase shifters 54A is determined by the thickness of the absorber layer 46 (FIG. 4B) and by the thickness of the dielectric layer 60. Since the dielectric layer 60 also provides a phase shift, the thickness of the dielectric material can be selected as required. Attenuated phase shifters can also be formed with a subjacent dielectric layer (not shown).

Figure 6:
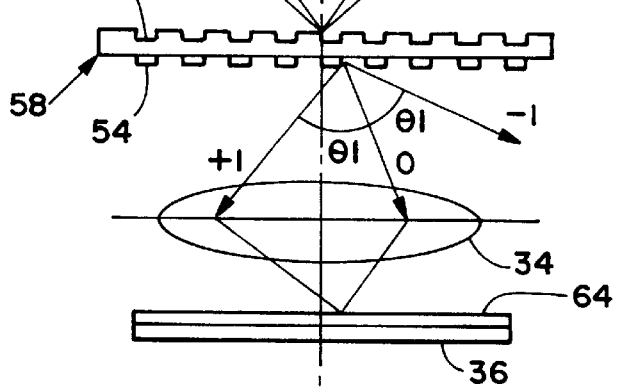
FIG. 6 is a schematic view of an ATOM lithographic system constructed utilizing a mask fabricated in accordance with the invention.

FIG. 6 illustrates the ATOM mask 58 in use in a lithographic system 62 during patterning of a layer of resist 64 formed on the target 36. The lithographic system 62 includes the exposure source 15 and the optical axis 14 as previously explained. In addition, the lithographic system 62 includes the condenser 24 and the objective lens 34 as previously explained. In the lithographic system 62, exposure energy (e.g., light) directed by the exposure source 15 through the diffraction phase shift grooves 52 produces off axis illumination for the attenuated phase shifters 54. The printed features on the layer of photoresist 64 will correspond to the primary mask pattern formed by the attenuated phase shifters 54. The off axis illumination improves the resolution (R) and depth of focus (DOF) of the corresponding features printed into the layer of photoresist 64 on the target 36. For attenuated phase shifters 54 formed in a line space pattern the printed features will also be formed in a line space pattern.

Figure 7A:
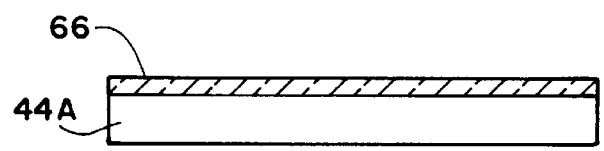
FIGS. 7A–7D are schematic cross sectional views illustrating process steps for fabricating an alternate embodiment lithographic mask with additive chromeless phase shifters.

Referring to FIGS. 7A–7D, steps in a method for forming an alternate embodiment phase shift mask 58B (FIG. 7D) using an additive process to form a diffraction grating 50A (FIG. 7D) are shown. Initially, as shown in FIG. 7A, a transparent substrate 44A is provided. The substrate 44A can be formed of quartz or other suitable material. A transparent additive layer 66 can be deposited on the substrate 44A. Suitable materials for the additive layer 66 include $SiO_2$, $Si_3N_4$, TEOS, spin-on-glass, and low temperature oxides. The additive layer 66 can be deposited to a desired thickness using CVD or other suitable deposition process.

Figure 7B:
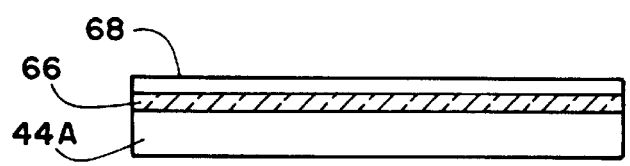

Next, as shown in FIG. 7B, a layer of resist 68 can be deposited on the additive layer 66 and exposed in a diffraction grating pattern. Exposure can be as previously explained, with a mask writer configured to write a desired grating pattern onto the layer of resist 68. The layer of resist 68 can be then be developed to form a resist mask for etching the additive layer 66.

Figure 7C:
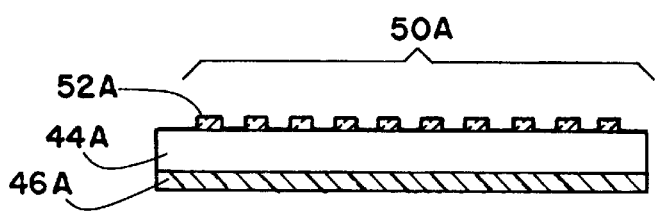

As shown in FIG. 7C, using the resist mask formed by the exposed and developed layer of resist 68 (FIG. 7B), the additive layer 66 can be etched to form additive diffraction phase shifters 52A. For an additive layer 66 formed of $SiO_2$ a wet etch can be performed using a solution of $NH_4F:HF$. For an additive layer 66 formed of $Si_3N_4$ a suitable dry etchant can be used.

The additive diffraction phase shifters 52A are equivalent in function to the diffraction phase shift grooves 52 (FIG. 4E) previously described. In addition, the additive diffraction phase shifters 52A are formed in a pattern which functions as a diffraction grating 50A. The diffraction grating 50A can be a simple line space pattern equivalent to the pattern shown in FIG. 5. The diffraction grating 50A functions to provide off axis illumination for attenuated phase shifters 54B (FIG. 7D) formed on an opposite side of the substrate 44A. In general, the pitch of the diffraction grating 50A can be selected to offer the maximum possible resolution and depth of focus depending on a given pattern for the subsequently formed attenuated phase shifters 54B.

Still referring to FIG. 7C, for forming the attenuated phase shifters 54B, an absorber layer 46A can be deposited on the substrate 44A. The absorber layer 46A can be formed of a material such as molybdenum silicide, or a mixture of chrome, nitrogen and oxygen. The absorber layer 46A can be blanket deposited on the substrate 44A and planarized to a thickness selected to absorb and phase shift exposure energy passing through the absorber layer 46A. A representative thickness of the absorber layer 46A can be several hundred angstroms or less.

In general, the thickness of the absorber layer 46A can be selected to absorb a certain percentage of the exposure energy during a lithographic process (e.g., 80%–95%). In addition, the thickness of the absorber layer 46A can be selected to produce a phase shift of π or odd whole multiple thereof for exposure energy transmitted through the layer. The absorber layer 46A can be patterned and etched using a resist mask (not shown) and a wet or dry etch process. One suitable wet etchant with the absorber layer 46A being a mixture of chrome, nitrogen and oxygen is CR-14. This etch step would remove portions of the absorber layer 46A to form "clear" areas of the mask 58B (i.e., areas between the subsequently formed phase shifters 54B-FIG. 7D). A desired phase shift (e.g., 180°) occurs between the "clear" areas and the subsequently formed phase shifters 54B.

Figure 7D:
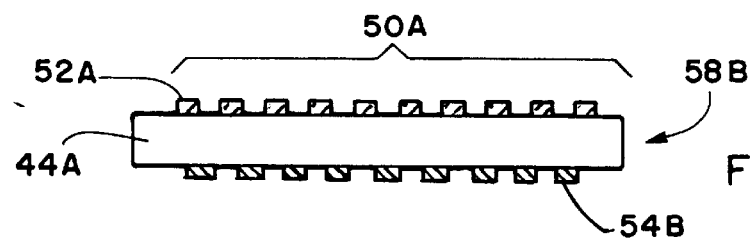

As shown in FIG. 7D, the completed mask 58B includes the attenuated phase shifters 54B and the diffraction grating 50A formed by the additive diffraction phase shifters 52A. The diffraction grating 50A functions substantially as previously explained to provide off axis illumination for the attenuated phase shifters 54B.

Figure 8:
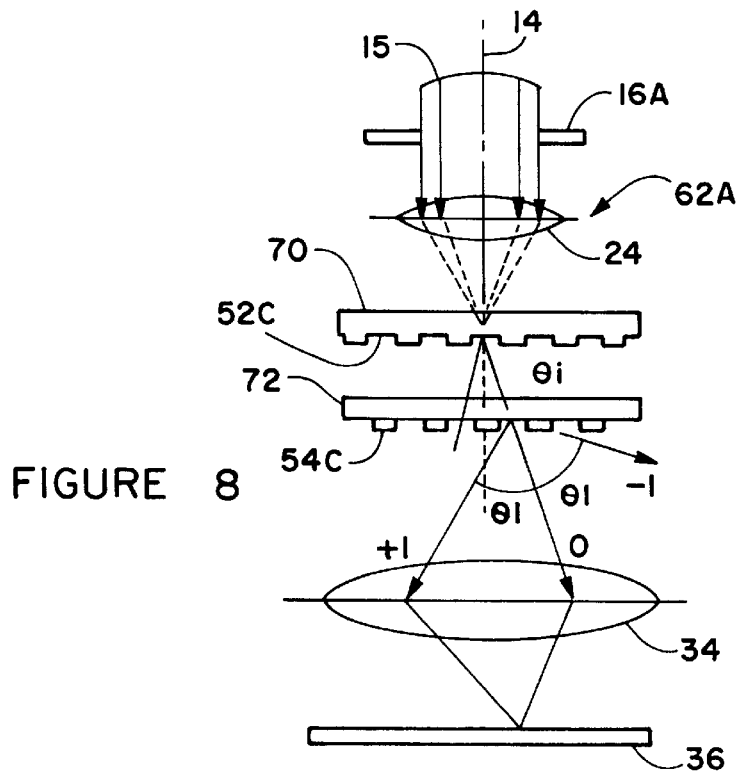
FIG. 8 is a schematic view of an alternate embodiment system constructed in accordance with the invention wherein a separate diffraction grating mask is employed with an attenuated phase shift mask.

Referring to FIG. 8, an alternate embodiment lithographic system 62A constructed in accordance with the invention includes a diffraction mask 70 and a separate attenuated phase shift mask 72. The diffraction mask 70 includes diffraction phase shifters 52C which function as previously explained in the manner of diffraction phase shift grooves 52 or additive diffraction phase shifters 52A. Specifically, the phase shifters 52C are formed in a pattern that provides a diffraction grating and diffracted light for off axis illumination. The attenuated phase shift mask 72 includes attenuated phase shifters 54C. The attenuated phase shifters 54C function as previously explained in the manner of attenuated phase shifters 54 (FIG. 4D). During a lithographic process using the system 62A, exposure energy directed through the diffraction mask 70 provides off axis illumination for the attenuated phase shift mask 72.

While the invention has been described with reference to certain preferred embodiments, as will be apparent to those skilled in the art, certain changes and modifications can be made without departing from the scope of the invention as defined by the following claims.

What is claimed is:

1. A lithographic mask comprising:

a transparent substrate;

a pattern of attenuated phase shifters proximate to a first side of the substrate, the attenuated phase shifters comprising an absorbing layer configured to absorb and phase shift an exposure energy directed through the mask; and a diffraction grating formed proximate to a second side of the substrate in alignment with the pattern of attenuated phase shifters and configured to diffract the exposure energy to illuminate the attenuated phase shifters and print a plurality of features corresponding to the attenuated phase shifters on a target.

2. The lithographic mask of claim 1 wherein the diffraction grating comprises a plurality of phase shift grooves formed in the substrate to a depth to provide a phase shift for the exposure energy.

3. The lithographic mask of claim 1 wherein the diffraction grating comprises a plurality of additive phase shifters comprising a transparent material on the substrate.

4. The lithographic mask of claim 1 wherein the attenuated phase shifters are configured to phase shift the exposure energy by π or odd multiple thereof.

5. The lithographic mask of claim 1 wherein the attenuated phase shifters comprise a dielectric layer on the absorbing layer.

6. A lithographic mask comprising:

a transparent substrate;

a plurality of attenuated phase shifters formed proximate to a first side of the substrate, the attenuated phase shifters comprising an absorbing material configured to absorb and phase shift an exposure energy directed through the mask; and a plurality of diffraction phase shifters formed proximate to a second side of the substrate in alignment with the attenuated phase shifters, the diffraction phase shifters configured to phase shift and diffract the exposure energy to provide off axis illumination for the attenuated phase shifters and to project a pattern of features corresponding to the attenuated phase shifters on a target.

7. The lithographic mask of claim 1 wherein the attenuated phase shifters and the diffraction phase shifters comprise line space patterns.

8. The lithographic mask of claim 1 wherein the diffraction phase shifters comprise a plurality of grooves etched into the substrate to a depth selected to provide a phase shift of π or odd multiple thereof.

9. The lithographic mask of claim 1 wherein the diffraction phase shifters comprise a phase layer deposited on the substrate to a thickness selected to provide a phase shift of π or odd multiple thereof.

10. A lithographic mask comprising:
a transparent substrate having a first side and a second opposing side;
a mask pattern on the first side of the substrate comprising a plurality of attenuated phase shifters, each phase shifter comprising an absorbing layer configured to absorb and phase shift an exposure energy passing therethrough by an amount equal to π or odd multiple thereof; and
a grating pattern formed on the second side of the substrate in alignment with the mask pattern, the grating pattern comprising a plurality of parallel spaced grooves etched into the substrate to a depth selected to phase shift and diffract the exposure energy passing there through to provide off axis illumination of the attenuated phase shifters for printing the mask pattern on a target.

11. The mask of claim 10 wherein the absorbing layer comprises a material selected from the group consisting of molybdenum silicide, and mixtures of chrome nitrogen and oxygen.

12. The mask of claim 10 wherein the depth of the grooves is selected to provide a phase shift of π or odd multiple thereof.

13. The mask of claim 10 wherein the primary mask pattern comprises a first line space pattern and the grating pattern comprises a second line space pattern.

14. The mask of claim 10 wherein a pitch of the grating pattern is selected to provide a desired resolution and depth of focus during illumination of the primary mask pattern.

15. A lithographic mask comprising:
a transparent substrate having a first side and a second side;
a plurality of attenuated phase shifters on the first side of the substrate forming a mash pattern, the attenuated phase shifters comprising an absorbing layer and a dielectric layer configured to absorb and phase shift an exposure energy directed through the mask; and
a plurality of chase shifters on the second side of the substrate in alignment with the attenuated phase shifters, the phase shifters comprising a transparent material deposited on the substrate to a thickness selected to phase shift the exposure energy for illuminating the attenuated phase shifters for projecting the mask pattern on a target.

16. The lithographic mask of claim 15 wherein the attenuated phase shifters are configured to provide a phase shift of π or whole multiple thereof.

17. The lithographic mask of claim 15 wherein the mask pattern comprises a line space pattern.

18. The lithographic mask of claim 15 wherein the absorbing layer comprises a material selected from the group consisting of molybdenum silicide and mixtures of chrome nitrogen and oxygen.

19. The lithographic mask of claim 15 wherein a pitch of the attenuated phase shifters is selected to provide a desired resolution and depth of focus for the mask pattern.

20. The lithographic mask of claim 15 wherein the thickness of the phase shifters is selected to provide a phase shift of π or odd multiple thereof.

21. A lithographic mask comprising:
a substrate having a first side and a second opposing side;
a mask pattern on the first side of the substrate comprising a plurality of attenuated phase shifters, each attenuated phase shifter comprising an absorbing layer configured to absorb and phase shift an exposure energy directed through the mask; and
a grating pattern formed on the second side of the substrate in alignment with the mask pattern, the grating pattern comprising a plurality of parallel spaced phase shift grooves etched into the substrate to a depth to diffract and phase shift the exposure energy for illuminating the attenuated phase shifters and protecting the mask pattern onto a target.

22. The mask of claim 21 wherein the substrate comprises a material selected from the group consisting of quartz and silica based glass.

23. The mask of claim 21 wherein the absorbing layer comprises a material selected from the group consisting of molybdenum silicide, and mixtures of chrome nitrogen and oxygen.

24. The mask of claim 21 wherein the depth is selected to provide a phase shift of π or odd multiple thereof for the exposure energy passing through the phase shift grooves relative to the exposure energy passing through a full thickness of the substrate.

25. A method for fabricating a lithographic mask comprising:
providing a transparent substrate having a first side and an opposing second side;
forming a plurality of attenuated phase shifters on the first side, the attenuated phase shifters comprising an absorbing layer configured to absorb and phase shift an exposure energy transmitted through the mask during a lithographic process; and
forming a plurality of phase shifters on the second side, the phase shifters configured to phase shift and diffract the exposure energy to provide off axis illumination for the attenuated phase shifters.

26. The method of claim 25 wherein forming the phase shifters comprise grooves etched in the substrate to a depth for producing a phase shift of π or odd multiple thereof.

27. The method of claim 25 wherein the phase shifters comprise a transparent phase layer on the substrate to a thickness for producing a phase shift of π or odd multiple thereof.

28. The method of claim 25 further comprising forming a transparent dielectric layer on the attenuated phase shifters.

29. The method as claimed in claim 25 further comprising forming a transparent dielectric layer between the attenuated phase shifters and the substrate.

30. A lithographic system comprising:
an exposure source for providing an exposure energy for patterning a layer of resist on a target;
a mask configured to transmit the exposure energy onto the target;
the mask comprising a plurality of attenuated phase shifters, each attenuated phase shifter comprising an absorbing layer configured to absorb and phase shift the exposure energy transmitted through the mask; and
a diffraction grating formed on the mask in alignment with the attenuated phase shifters, the diffraction grating comprising a plurality of phase shifters configured to diffract the exposure energy to provide off axis illumination for the attenuated phase shifters during patterning of the layer of resist.

31. The system of claim 30 wherein each phase shifter comprises a phase shift groove.

32. The system of claim 30 wherein each phase shifter comprises a phase layer.

33. The system of claim 30 wherein each attenuated phase shifter comprises a dielectric layer.

34. A lithographic system comprising:

an exposure source for providing an exposure energy;

a mask comprising a transparent substrate configured to project the exposure energy onto a target;

a plurality of attenuated phase shifters formed proximate to a first side of the substrate, each attenuated phase shifter comprising an absorbing layer configured to absorb and phase shift the exposure energy by an amount equal to $\pi$ or odd multiple thereof; and a plurality of diffraction phase shifters formed proximate to a second side of the substrate in alignment with the attenuated phase shifters, the diffraction phase shifters comprising a diffraction grating configured to diffract the exposure energy to provide off axis illumination for the attenuated phase shifters for printing features corresponding to the attenuated phase shifters on the target.

35. The system of claim 34 wherein each attenuated phase shifter comprises a dielectric layer on the absorbing layer.

36. The system of claim 34 wherein each diffraction phase shifter comprises a groove etched into the substrate to a selected depth.

37. The system of claim 34 wherein each diffraction phase shifter comprises a transparent chase layer deposited on the substrate to a selected thickness.

* * * * *

UNITED STATES PATENT AND TRADEMARK OFFICE
CERTIFICATE OF CORRECTION

PATENT NO. : 5,851,701
DATED : December 22, 1998
INVENTOR(S) : J. Brett Rolfson

It is certified that error appears in the above-identified patent and that said Letters Patent is hereby corrected as shown below:

On the title page, item [75] should read
-- Inventor: J. BRETT ROLFSON --.

In column 9, line 46, change "chase" to --phase--;

Signed and Sealed this

Twentieth Day of April, 1999

Attest:

Q. TODD DICKINSON

*Attesting Officer*   Acting Commissioner of Patents and Trademarks